(12) United States Patent
Xu et al.

(10) Patent No.: US 12,628,683 B2
(45) Date of Patent: May 12, 2026

(54) METHODS OF IMPROVING WIRE BONDING OPERATIONS

(71) Applicant: Kulicke and Soffa Industries, Inc., Fort Washington, PA (US)

(72) Inventors: Hui Xu, Fort Washington, PA (US); Wei Qin, Fort Washington, PA (US); Jeongho Yang, Fort Washington, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 611 days.

(21) Appl. No.: 18/139,209

(22) Filed: Apr. 25, 2023

(65) Prior Publication Data

US 2023/0352443 A1 Nov. 2, 2023

Related U.S. Application Data

(60) Provisional application No. 63/336,227, filed on Apr. 28, 2022.

(51) Int. Cl.
H10W 72/00 (2026.01)

(52) U.S. Cl.
CPC .... H10W 72/075 (2026.01); H10W 72/07531 (2026.01)

(58) Field of Classification Search
CPC ...................... H10W 72/075; H10W 72/07531
USPC .......................................................... 438/5
See application file for complete search history.

(56) References Cited

U.S. PATENT DOCUMENTS

| | | | | |
|---|---|---|---|---|
| 5,443,200 A | * | 8/1995 | Arikado | B23K 20/005 |
| | | | | 228/8 |
| 8,415,245 B2 | | 4/2013 | Takata et al. | |
| 2008/0283578 A1 | | 11/2008 | Bambridge et al. | |
| 2013/0256385 A1 | * | 10/2013 | Sugito | B23K 3/08 |
| | | | | 228/10 |
| 2014/0054277 A1 | * | 2/2014 | Sugito | B23K 9/0008 |
| | | | | 219/136 |
| 2016/0358883 A1 | * | 12/2016 | Yoshino | H10W 72/015 |
| 2019/0287941 A1 | * | 9/2019 | Maruya | B23K 20/007 |
| 2020/0006161 A1 | * | 1/2020 | Gillotti | H10P 74/203 |
| 2020/0348243 A1 | | 11/2020 | Song et al. | |
| 2020/0350216 A1 | * | 11/2020 | Gillotti | H10P 74/203 |

FOREIGN PATENT DOCUMENTS

| | | |
|---|---|---|
| JP | 2011-060940 | 3/2011 |
| JP | 2021-022637 | 2/2021 |

OTHER PUBLICATIONS

International Search Report for PCT application No. PCT/US2023/019849 completed on Aug. 18, 2023.

* cited by examiner

*Primary Examiner* — Didarul A Mazumder
(74) *Attorney, Agent, or Firm* — Christopher M. Spletzer, Sr.

(57) ABSTRACT

A method of determining a new search height for a wire bonding process is provided. The method includes the steps of: providing a search height; performing a plurality of wire bonding operations using the search height; monitoring wire bonding evaluation criteria during each of the plurality of wire bonding operations; and determining a new search height using the monitored wire bonding evaluation criteria.

25 Claims, 7 Drawing Sheets

FIG. 1

T1: START BLOCKOUT TIME
T2: START SEEK TIME
T3: CONTACT DECLARE

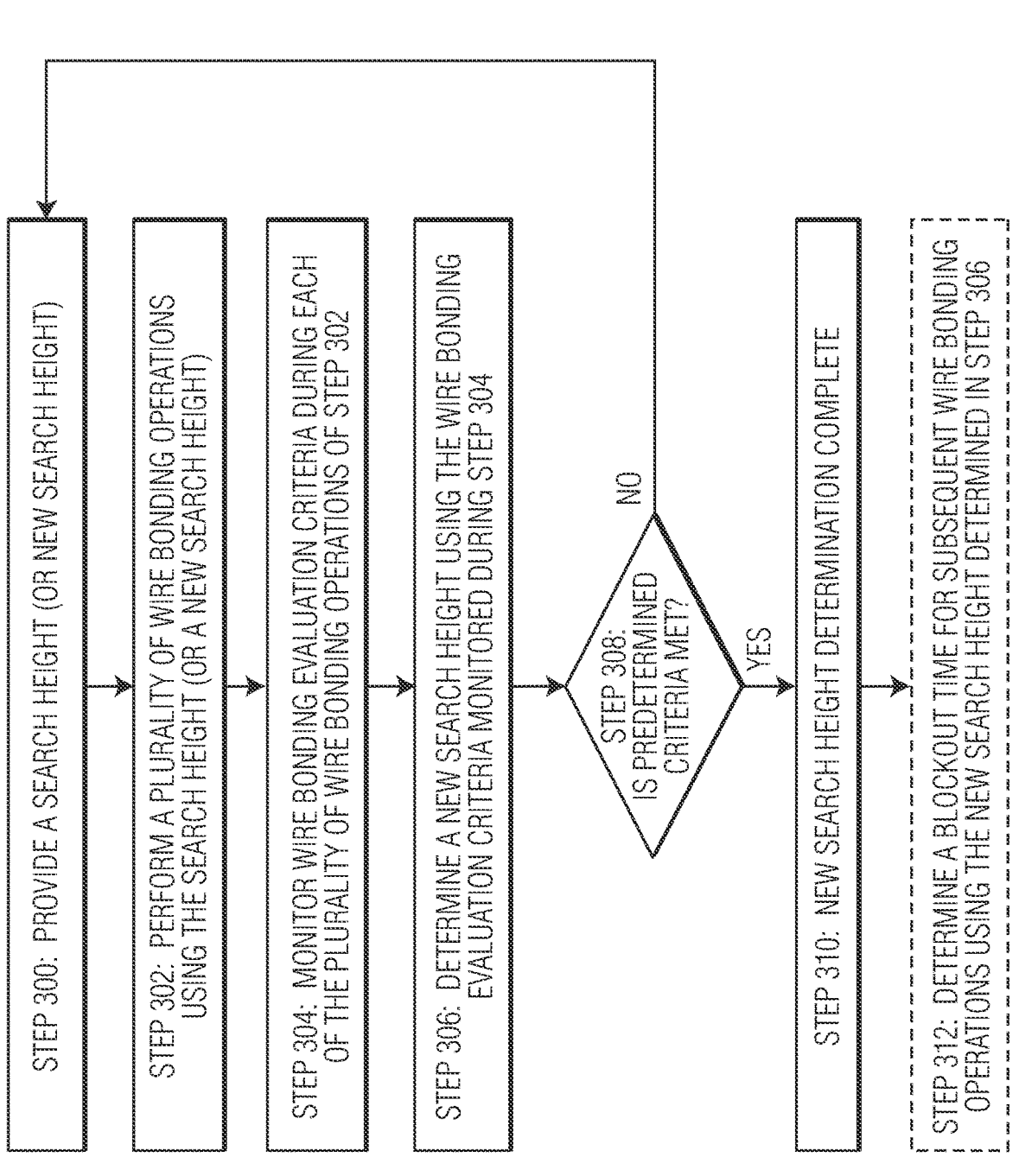

FIG. 3

STEP 300: PROVIDE A SEARCH HEIGHT (OR NEW SEARCH HEIGHT)

STEP 302: PERFORM A PLURALITY OF WIRE BONDING OPERATIONS USING THE SEARCH HEIGHT (OR A NEW SEARCH HEIGHT)

STEP 304: MONITOR WIRE BONDING EVALUATION CRITERIA DURING EACH OF THE PLURALITY OF WIRE BONDING OPERATIONS OF STEP 302

STEP 306: DETERMINE A NEW SEARCH HEIGHT USING THE WIRE BONDING EVALUATION CRITERIA MONITORED DURING STEP 304

STEP 308: IS PREDETERMINED CRITERIA MET?

NO

YES

STEP 310: NEW SEARCH HEIGHT DETERMINATION COMPLETE

STEP 312: DETERMINE A BLOCKOUT TIME FOR SUBSEQUENT WIRE BONDING OPERATIONS USING THE NEW SEARCH HEIGHT DETERMINED IN STEP 306

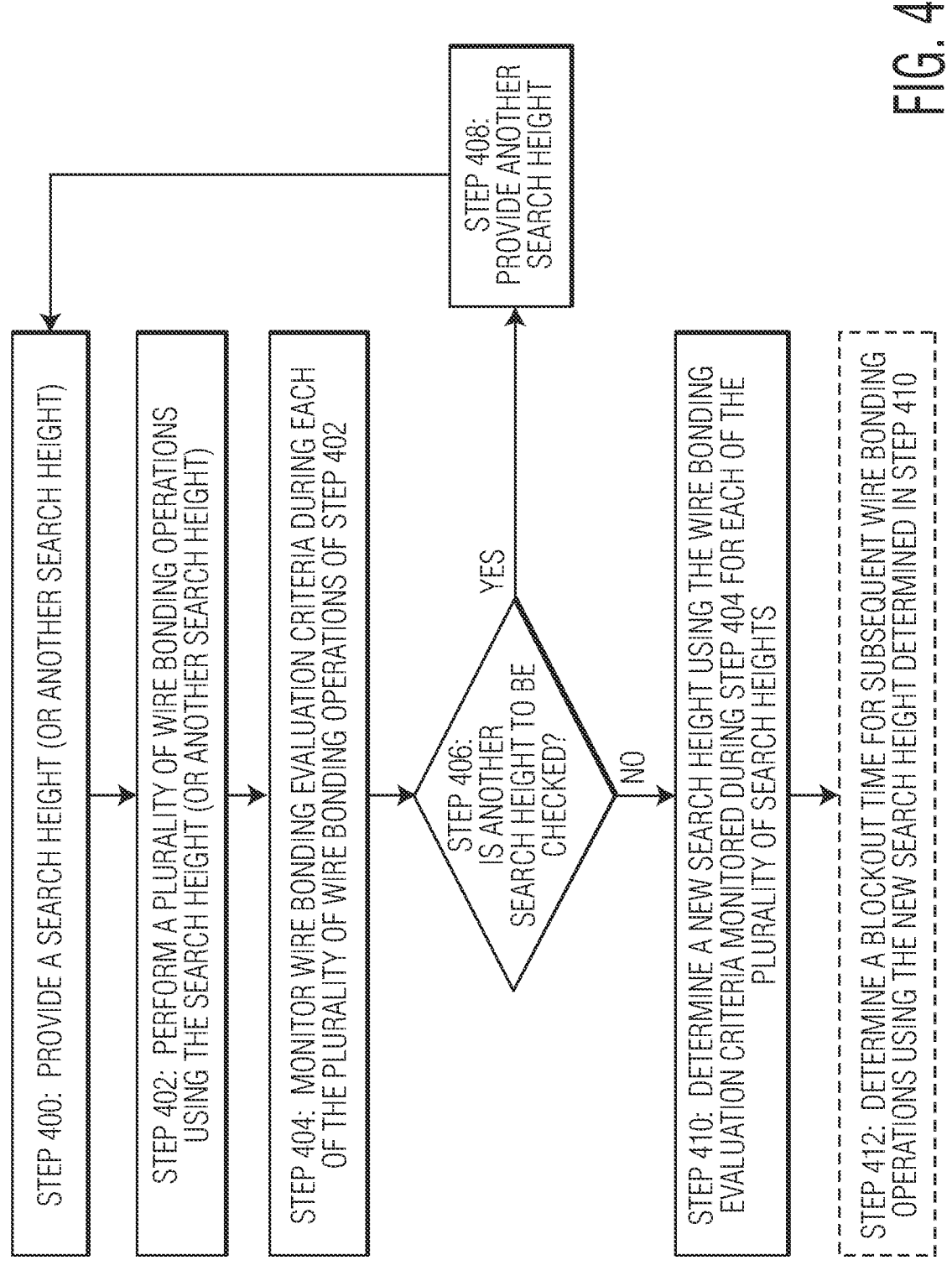

FIG. 4

STEP 400:  PROVIDE A SEARCH HEIGHT (OR ANOTHER SEARCH HEIGHT)

STEP 402:  PERFORM A PLURALITY OF WIRE BONDING OPERATIONS USING THE SEARCH HEIGHT (OR ANOTHER SEARCH HEIGHT)

STEP 404:  MONITOR WIRE BONDING EVALUATION CRITERIA DURING EACH OF THE PLURALITY OF WIRE BONDING OPERATIONS OF STEP 402

STEP 406:  IS ANOTHER SEARCH HEIGHT TO BE CHECKED?

YES

STEP 408:  PROVIDE ANOTHER SEARCH HEIGHT

NO

STEP 410:  DETERMINE A NEW SEARCH HEIGHT USING THE WIRE BONDING EVALUATION CRITERIA MONITORED DURING STEP 404 FOR EACH OF THE PLURALITY OF SEARCH HEIGHTS

STEP 412:  DETERMINE A BLOCKOUT TIME FOR SUBSEQUENT WIRE BONDING OPERATIONS USING THE NEW SEARCH HEIGHT DETERMINED IN STEP 410

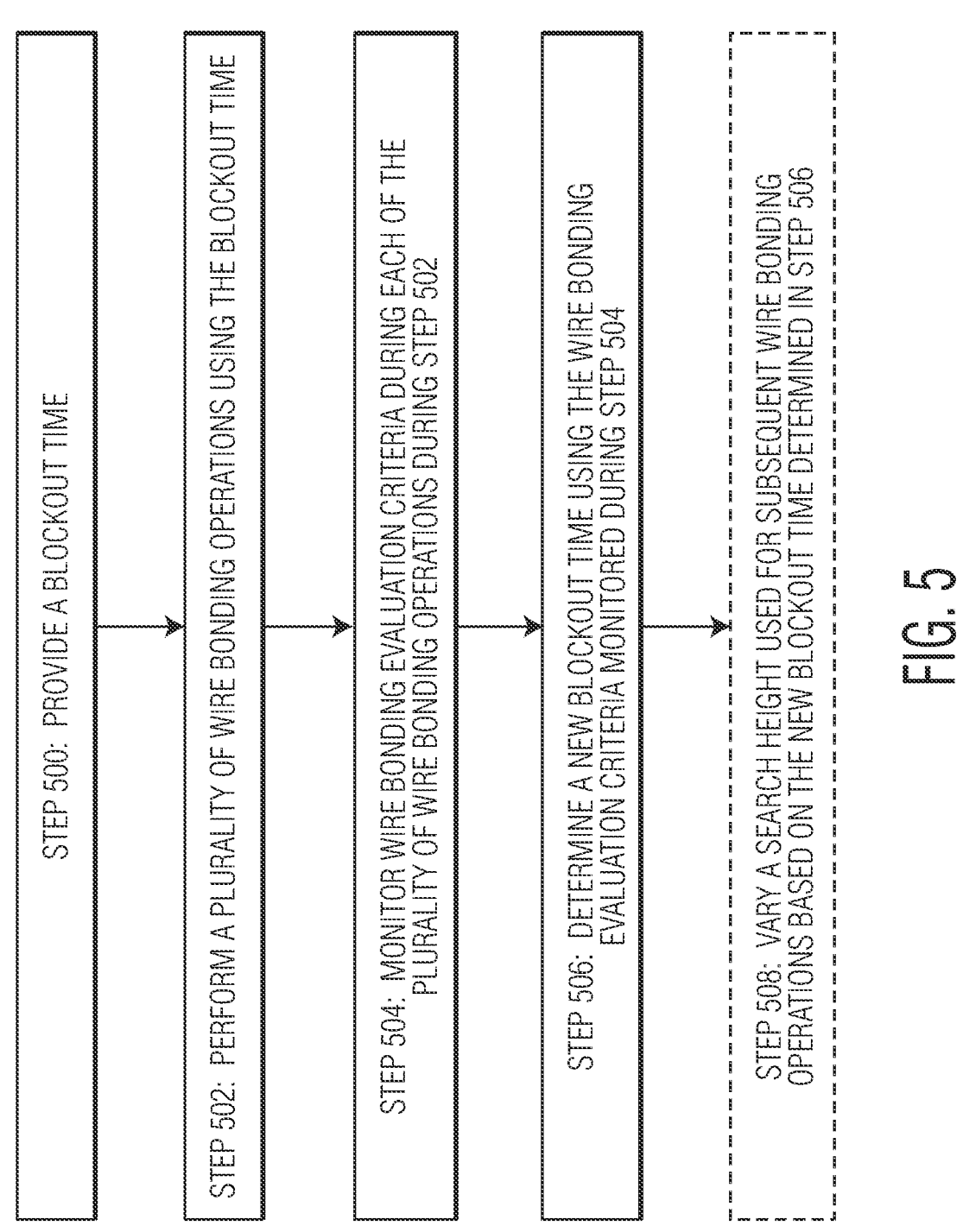

STEP 500: PROVIDE A BLOCKOUT TIME

STEP 502: PERFORM A PLURALITY OF WIRE BONDING OPERATIONS USING THE BLOCKOUT TIME

STEP 504: MONITOR WIRE BONDING EVALUATION CRITERIA DURING EACH OF THE PLURALITY OF WIRE BONDING OPERATIONS DURING STEP 502

STEP 506: DETERMINE A NEW BLOCKOUT TIME USING THE WIRE BONDING EVALUATION CRITERIA MONITORED DURING STEP 504

STEP 508: VARY A SEARCH HEIGHT USED FOR SUBSEQUENT WIRE BONDING OPERATIONS BASED ON THE NEW BLOCKOUT TIME DETERMINED IN STEP 506

FIG. 5

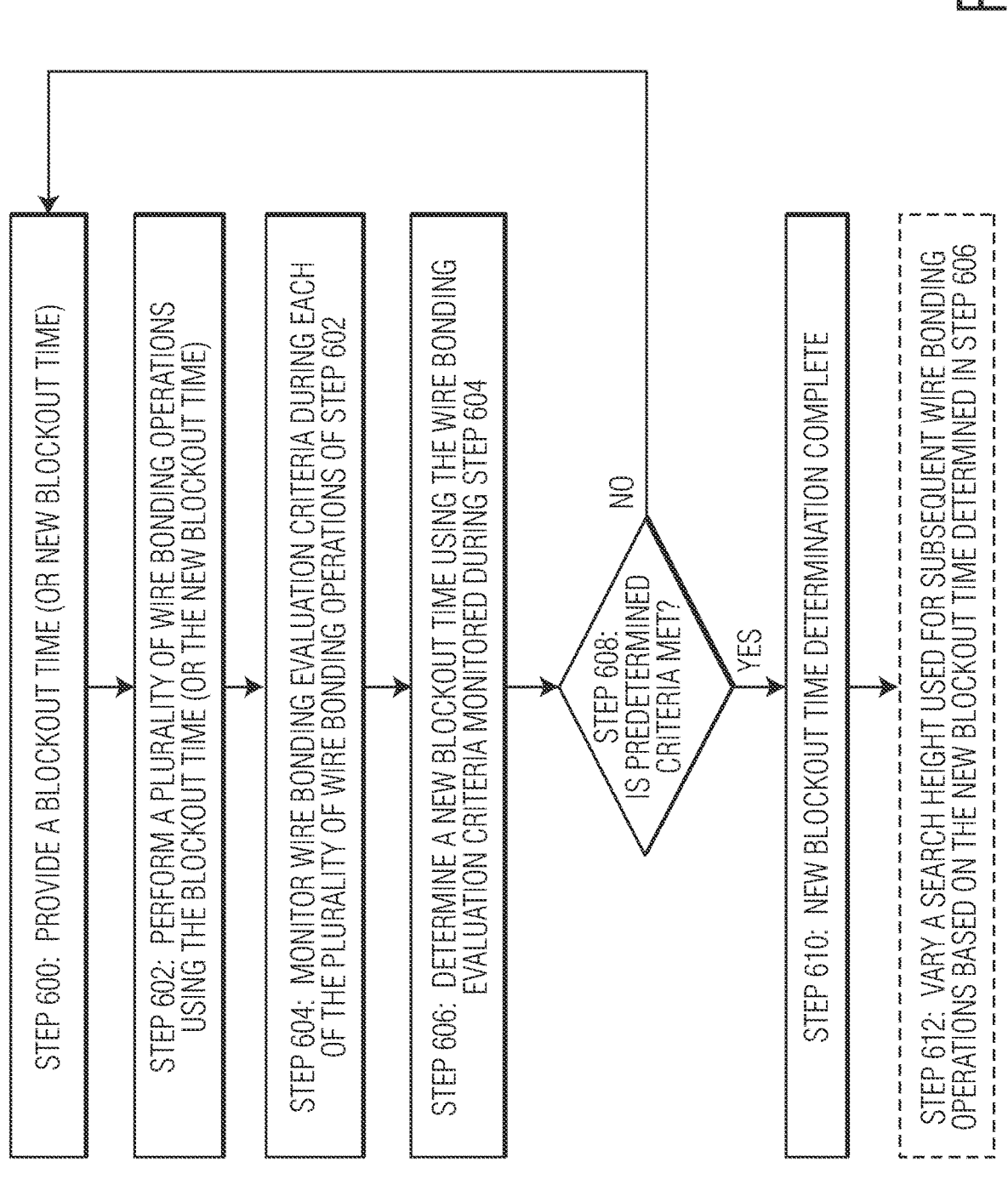

STEP 600:  PROVIDE A BLOCKOUT TIME (OR NEW BLOCKOUT TIME)

STEP 602:  PERFORM A PLURALITY OF WIRE BONDING OPERATIONS USING THE BLOCKOUT TIME (OR THE NEW BLOCKOUT TIME)

STEP 604:  MONITOR WIRE BONDING EVALUATION CRITERIA DURING EACH OF THE PLURALITY OF WIRE BONDING OPERATIONS OF STEP 602

STEP 606:  DETERMINE A NEW BLOCKOUT TIME USING THE WIRE BONDING EVALUATION CRITERIA MONITORED DURING STEP 604

STEP 608:  IS PREDETERMINED CRITERIA MET?

NO

YES

STEP 610:  NEW BLOCKOUT TIME DETERMINATION COMPLETE

STEP 612:  VARY A SEARCH HEIGHT USED FOR SUBSEQUENT WIRE BONDING OPERATIONS BASED ON THE NEW BLOCKOUT TIME DETERMINED IN STEP 606

FIG. 6

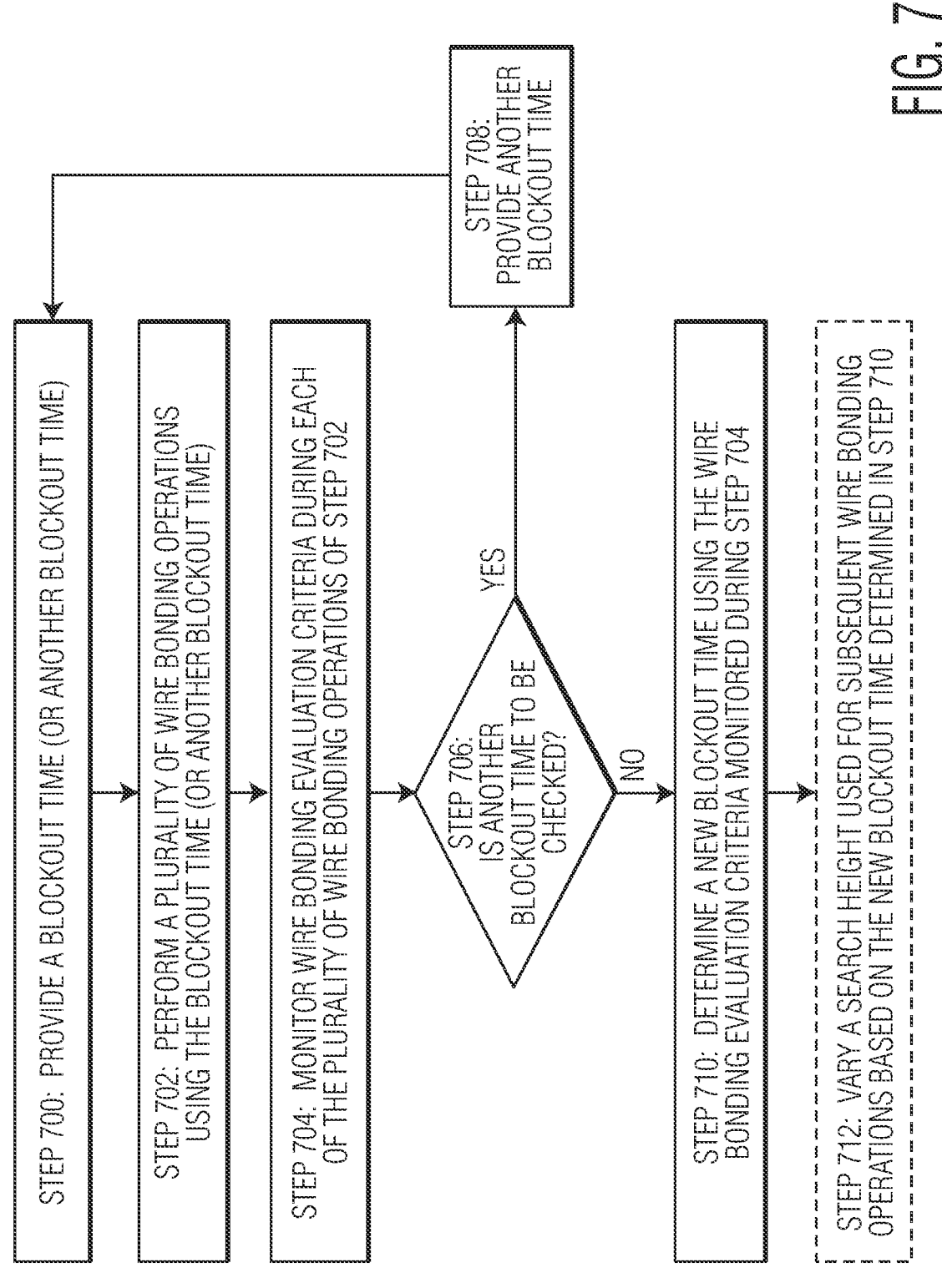

STEP 700: PROVIDE A BLOCKOUT TIME (OR ANOTHER BLOCKOUT TIME)

STEP 702: PERFORM A PLURALITY OF WIRE BONDING OPERATIONS USING THE BLOCKOUT TIME (OR ANOTHER BLOCKOUT TIME)

STEP 704: MONITOR WIRE BONDING EVALUATION CRITERIA DURING EACH OF THE PLURALITY OF WIRE BONDING OPERATIONS OF STEP 702

STEP 706: IS ANOTHER BLOCKOUT TIME TO BE CHECKED?

STEP 708: PROVIDE ANOTHER BLOCKOUT TIME

YES

NO

STEP 710: DETERMINE A NEW BLOCKOUT TIME USING THE WIRE BONDING EVALUATION CRITERIA MONITORED DURING STEP 704

STEP 712: VARY A SEARCH HEIGHT USED FOR SUBSEQUENT WIRE BONDING OPERATIONS BASED ON THE NEW BLOCKOUT TIME DETERMINED IN STEP 710

FIG. 7

METHODS OF IMPROVING WIRE BONDING OPERATIONS

CROSS REFERENCE TO RELATED APPLICATION

This application claims the benefit of U.S. Provisional Application No. 63/336,227, filed on Apr. 28, 2022, the content of which is herein incorporated by reference.

FIELD

The invention relates to wire bonding operations, and in particular, to techniques for improving wire bonding operations, for example, in terms of time efficiency.

BACKGROUND

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine), wire loops are formed between respective locations to be electrically interconnected. The primary methods of forming wire loops are ball bonding and wedge bonding. In forming the bonds between (a) the ends of the wire loop and (b) the bond site (e.g., a die pad, a lead, etc.) varying types of bonding energy may be used, including, for example, ultrasonic energy, thermosonic energy, thermocompressive energy, amongst others. Wire bonding machines (e.g., stud bumping machines) are also used to form conductive bumps from portions of wire.

In certain applications, the process of forming a wire loop includes positioning a wire bonding tool at a height above a workpiece, and then moving the wire bonding tool to contact the workpiece in connection with a wire bonding operation. The time that elapses between (i) the height above the workpiece, and (ii) the contact with the workpiece, is critical to the efficiency of the wire bonding operation.

Thus, it would be desirable to provide improved wire bonding operations, including as related to the timing and efficiency of such operations.

SUMMARY

According to an exemplary embodiment of the invention, a method of determining a new search height for a wire bonding process is provided. The method includes: (a) providing a search height; (b) performing a plurality of wire bonding operations using the search height; (c) monitoring wire bonding evaluation criteria during each of the plurality of wire bonding operations of step (b); and (d) determining a new search height using the wire bonding evaluation criteria monitored during step (c).

According to another exemplary embodiment of the invention, a method of determining a new blockout time for a wire bonding process is provided. The method includes: (a) providing a blockout time, the blockout time being a time after a wire bonding tool is at a search height in a wire bonding operation but before the wire bonding tool enters a seek mode; (b) performing a plurality of wire bonding operations using the blockout time; (c) monitoring wire bonding evaluation criteria during each of the plurality of wire bonding operations during step (b); and (d) determining a new blockout time using the wire bonding evaluation criteria monitored during step (c).

The methods of the present invention may also be embodied as an apparatus (e.g., as part of the intelligence of a wire bonding machine), or as computer program instructions on a computer readable carrier (e.g., a computer readable carrier including a wire bonding program used in connection with a wire bonding machine).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 1 is a timing diagram illustrating points of interest for performing methods in accordance with various exemplary embodiments of the invention;

FIGS. 2-4 are flow diagrams for performing various methods of determining a new search height for a wire bonding process in accordance with various exemplary embodiments of the invention; and FIGS. 5-7 are flow diagrams for performing various methods of determining a new blockout time for a wire bonding process in accordance with various exemplary embodiments of the invention.

DETAILED DESCRIPTION

Figure 2:
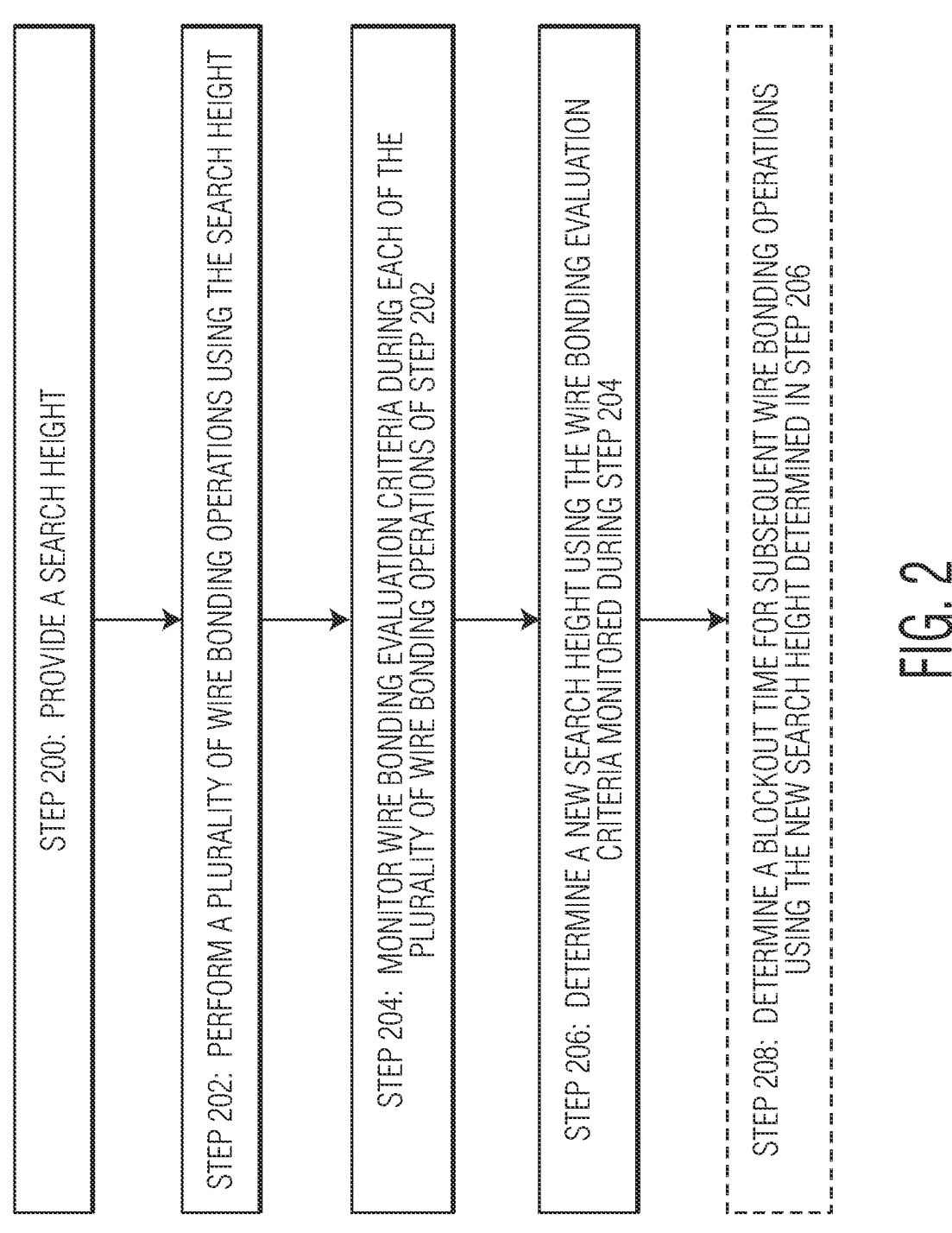

Exemplary aspects of the invention relate to monitoring signals on a wire bonding system (e.g., a seek time signal, a seek distance signal, an impact force signal, an impact squash signal, etc.) as feedback to automatically adjust (and to improve, and to potentially optimize) a wire bonding tool height. By adjusting the wire bonding tool height (e.g., the search height), performance and efficiency (e.g., UPH, units per hour) of a wire bonding operation may be improved. Further, a communication (e.g., a warning message) may be sent to an operator if the wire bonding tool height (e.g., the search height) is not optimal or has shifted. Further, the monitored seek time (or seek distance) and/or impact force (or impact squash) may be used in connection with a closed loop adjustment of the wire bonding tool height (e.g., the search height). Such a closed loop adjustment may be an automated process (e.g., performed using software on a wire bonding system, without operator intervention).

In accordance with certain exemplary aspects of the invention, a desirable (and perhaps optimal) search height may be achieved when the minimum seek time (or seek distance) meets a threshold. If the seek time (or seek distance) is too long, the UPH of the wire bonding system is negatively impacted. If the seek time (or seek distance) is too short, bonding quality on the wire bonding system may suffer.

In accordance with certain exemplary aspects of the invention, a desirable (and perhaps optimal) impact force (and/or impact squash) may be achieved. If the impact force (or impact squash) is too high, it generally means the search height is too low, potentially resulting in reduced bonding quality.

In accordance with certain exemplary aspects of the invention, the variation of seek time (or seek distance) and impact force (or impact squash) may also be analyzed for wire bonding tool height optimization, to monitor the health of a wire bonding system.

As used herein, the term "search height" refers to a height of a wire bonding tool above a bonding location at a transition from a high speed to a lower speed. An example of search height is a transition point between (i) a high speed descent and (ii) entry into a lower constant velocity (i.e., CV) mode.

As used herein, the term "seek time" refers to a time period between (i) an initiation of seeking contact between the wire bonding tool and a bonding location and (ii) a contact being declared between the wire bonding tool and the bonding location. As used herein, the term "seek distance" refers to a distance between (i) an initiation of seeking contact between the wire bonding tool and a bonding location and (ii) a contact being declared between the wire bonding tool and the bonding location.

As used herein, the term "seek mode" refers to initiation of seeking contact between the wire bonding tool and a bonding location.

As used herein, the term "blockout time" refers to a time after a wire bonding tool is at a search height in a wire bonding operation but before the wire bonding tool enters a seek mode. In certain applications, the blockout time may be referred to as a "seek delay".

Figure 1:
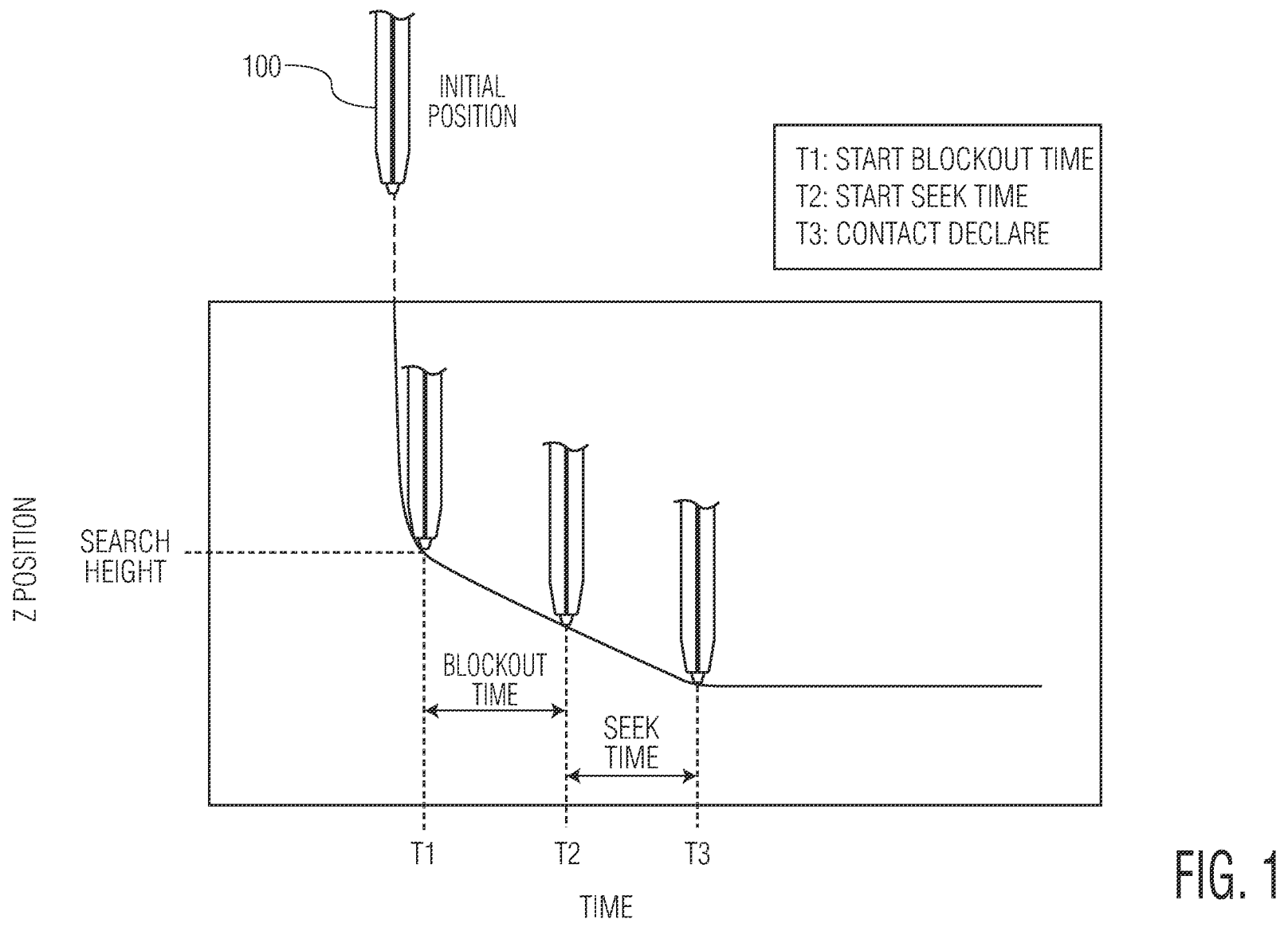

Referring now to the drawings, FIG. 1 is a timing diagram illustrating points of interest for performing various methods in accordance with the invention (including the embodiments shown in FIGS. 2-7). The vertical axis illustrates the z-axis position of a wire bonding tool 100. The horizontal axis illustrates time as wire bonding tool 100 descends in connection with a wire bonding operation. FIG. 1 illustrates wire bonding tool 100 at an initial position above a workpiece (the workpiece is not illustrated). This initial position refers to some position during a rapid descent of wire bonding tool 100. At time T1, wire bonding tool 100 reaches a search height. At this search height there has been a transition from a high speed to a lower speed (e.g., a lower constant velocity). Wire bonding tool 100 continues to descend between time T1 and time T2. The time period between time T1 and time T2 may be referred to as a "blockout time". This is the time after reaching the search height but before entering a seek mode.

At time T2, the seek mode begins. The seek mode refers to an operational mode during which the system is monitoring for contact between wire bonding tool 100 and a bonding location. Contact between wire bonding tool 100 and the bonding location is declared at time T3. Thus, the time between time T2 (when the seek mode begins) and time T3 (where contact is declared) is referred to as the "seek time" (or if distance is monitored, the "seek distance").

FIGS. 2-4 are flow diagrams illustrating exemplary methods of determining a new search height for a wire bonding process in accordance with the invention. FIGS. 5-7 are flow diagrams illustrating exemplary methods of determining a new blockout time for a wire bonding process in accordance with the invention. As is understood by those skilled in the art, certain steps included in the flow diagrams may be omitted; certain additional steps may be added; and the order of the steps may be altered from the order illustrated—all within the scope of the invention.

Referring now to FIG. 2, a method of determining a new search height for a wire bonding process is illustrated. At Step 200, a search height is provided (e.g., the search height in FIG. 1). At Step 202, a plurality of wire bonding operations are performed using the search height provided from Step 200. At Step 204, wire bonding evaluation criteria are monitored during each of the plurality of wire bonding operations of Step 202. For example, such wire bonding evaluation criteria may include signals monitored during Step 204 and related to at least one of (i) a seek time of a wire bonding tool, (ii) a seek distance of the wire bonding tool, (iii) an impact force of the wire bonding tool, (iv) an impact squash of the wire bonding tool, (v) a z-axis deformation profile, (vi) a bond force oscillation profile, (vii) an ultrasonic impedance characteristic, and (viii) a servo performance of an xyz motion system of a wire bonding machine.

At Step 206, a new search height is determined using the wire bonding evaluation criteria monitored during Step 204. For example, the criteria monitored during Step 204 may indicate that the seek time (or seek distance) is too long—in which case the new search height may be lower. In another example, the criteria monitored during Step 204 may indicate that the seek time (or seek distance) is too short—in which case the new search height may be higher. In other examples, different criteria (e.g., impact force, impact squash, etc.) monitored in Step 204 may be used to adjust the search height in Step 206.

The new search height determined in Step 206 may be the same as the prior search height (e.g., the search height provided at Step 200), or it may be a different search height. According to certain exemplary embodiments of the invention, the new search height may be determined to be low enough to provide a time-efficient wire bonding process while providing an acceptable level of the wire bonding evaluation criteria monitored in Step 204. At optional Step 208, a blockout time is determined for subsequent wire bonding operations using the new search height determined in Step 206.

Referring now to FIG. 3, a method of determining a new search height for a wire bonding process is illustrated. At Step 300, a search height (or a new search height of Step 306) is provided (e.g., the search height in FIG. 1). At Step 302, a plurality of wire bonding operations are performed using the search height from Step 300 (or a new search height of Step 306). At Step 304, wire bonding evaluation criteria (see exemplary criteria described above in connection with Step 204) are monitored during each of the plurality of wire bonding operations of Step 302. At Step 306, a new search height is determined using the wire bonding evaluation criteria monitored during Step 304 (see description above in connection with Step 206).

At Step 308, it is determined if some predetermined criteria is met. This predetermined criteria may be any criteria as desired in the specific application. For example, the predetermined criteria may be related to criteria monitored in Step 304 (e.g., seek time, seek distance, impact force, impact squash, etc.). Alternatively, the predetermined criteria from Step 308 may be different criteria such as a minimum or maximum number of iterations (or a maximum timeout) having been completed. If the answer to the decision block of Step 308 is "no," Steps 300-306 are repeated with a new search height. If the answer to the decision block of Step 308 is "yes," at Step 310, a new search height determination is complete. At optional Step 312, a blockout time is determined for subsequent wire bonding operations using the new search height determined in Step 306.

Referring now to FIG. 4, a method of determining a new search height for a wire bonding process is illustrated. According to this method, a plurality of search heights are to be checked in order to determine a desirable (and perhaps best) search height. For example, a plurality of search heights may be known before proceeding with the method, and each of the known plurality of search heights are checked.

At Step 400, a search height (or another search height of Step 408) is provided (e.g., the search height in FIG. 1). At Step 402, a plurality of wire bonding operations are performed using the search height from Step 400 (or another search height of Step 408). At Step 404, wire bonding evaluation criteria are monitored during each of the plurality of wire bonding operations of Step 402 (see exemplary criteria described above in connection with Step 204). At Step 406, a determination is made if another search height is to be checked (i.e., have all of a known plurality of search heights been checked). If the answer to the decision block of Step 406 is "yes," another search height is provided at Step 408 and Steps 400-404 are repeated. If the answer to the decision block of Step 406 is "no," at Step 410, a new search height determination is completed (see description above in connection with Step 206, but also in Step 410 the new search height may be determined using the evaluation criteria monitored for each of the plurality of search heights). At optional Step 412, a blockout time for subsequent wire bonding operations is determined using the new search height determined in Step 410.

Referring now to FIG. 5, a method of determining a new blockout time for a wire bonding process is illustrated. At Step 500, a blockout time is provided (e.g., the blockout time in FIG. 1). At Step 502, a plurality of wire bonding operations are performed using the blockout time provided from Step 500. At Step 504, wire bonding evaluation criteria are monitored during each of the plurality of wire bonding operations of Step 502 (see exemplary criteria described above in connection with Step 204). At Step 506, a new blockout time is determined using the wire bonding evaluation criteria monitored during Step 504.

The new blockout time determined in Step 506 may be the same as the prior blockout time (e.g., the blockout time provided at Step 500), or it may be a different blockout time. According to certain exemplary embodiments of the invention, the new blockout time may be determined to be short enough to provide a time efficient wire bonding process while providing an acceptable level of the wire bonding evaluation criteria monitored in Step 504.

At optional Step 508, the search height used for subsequent wire bonding operations is varied based on the new blockout time determined in Step 506. For example, the search height may be increased if the new blockout time is longer (e.g., than a prior blockout time), and decreased if the new blockout time is shorter (e.g., than a prior blockout time).

Referring now to FIG. 6, a method of determining a new blockout time for a wire bonding process is illustrated. At Step 600, a blockout time (or a new blockout time of Step 606) is provided (e.g., the blockout time in FIG. 1). At Step 602, a plurality of wire bonding operations are performed using the blockout time from Step 600 (or a new blockout time of Step 606). At Step 604, wire bonding evaluation criteria are monitored during each of the plurality of wire bonding operations of Step 602 (see exemplary criteria described above in connection with Step 204). At Step 606, a new blockout time is determined using the wire bonding evaluation criteria monitored during Step 604.

At Step 608, it is determined if some predetermined criteria is met. This predetermined criteria may be any criteria as desired in the specific application. For example, the predetermined criteria may be related to criteria monitored in Step 604 (e.g., seek time, seek distance, impact force, impact squash, etc.). Alternatively, the predetermined criteria from Step 608 may be different criteria such as a minimum or maximum number of iterations (or a maximum timeout) having been completed. If the answer to the decision block of Step 608 is "no," Steps 600-606 are repeated with a new blockout time. If the answer to the decision block of Step 608 is "yes," at Step 610, a new blockout time determination is complete. At optional Step 612, the search height used for subsequent wire bonding operations is varied based on the new blockout time determined in Step 606 (see description of Step 508 above).

Referring now to FIG. 7, a method of determining a new blockout time for a wire bonding process is illustrated. According to this method, a plurality of blockout times are to be checked in order to determine a desirable (and perhaps best) blockout time. For example, a plurality of blockout times may be known before proceeding with the method, and each of the known plurality of blockout times are checked.

At Step 700, a blockout time (or another blockout time of Step 708) is provided (e.g., the blockout time in FIG. 1). At Step 702, a plurality of wire bonding operations are performed using the blockout time from Step 700 (or another blockout time of Step 708). At Step 704, wire bonding evaluation criteria are monitored during each of the plurality of wire bonding operations of Step 702 (see exemplary criteria described above in connection with Step 204). At Step 706, a determination is made if another blockout time is to be checked (i.e., have all of a known plurality of blockout times been checked). If the answer to the decision block of Step 706 is "yes," another blockout time is provided at Step 708 and Steps 700-704 are repeated. If the answer to the decision block of Step 706 is "no," at Step 710, a new blockout time determination is completed (see description above in connection with Step 506, but also in Step 710 the new blockout time may be determined using the evaluation criteria monitored for each of the plurality of blockout times). At optional Step 712, the search height used for subsequent wire bonding operations is varied based on the new blockout time determined in Step 710 (see description of Step 508 above).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of determining a new search height for a wire bonding process, the method comprising steps of:
   (a) providing a search height;
   (b) performing a plurality of wire bonding operations using the search height;
   (c) monitoring wire bonding evaluation criteria during each of the plurality of wire bonding operations of the step (b); and
   (d) determining the new search height using the wire bonding evaluation criteria monitored during the step (c).

2. The method of claim 1, wherein the new search height is a height of a wire bonding tool above a bonding location prior to entering a constant velocity mode.

3. The method of claim 1, wherein the wire bonding evaluation criteria includes signals monitored during the step (c) and related to at least one of (i) a seek time of a wire bonding tool, (ii) a seek distance of the wire bonding tool, (iii) an impact force of the wire bonding tool, (iv) an impact squash of the wire bonding tool, (v) a z-axis deformation profile, (vi) a bond force oscillation profile, (vii) an ultrasonic impedance characteristic, and (viii) a servo performance of an xyz motion system of a wire bonding machine.

4. The method of claim 1, wherein during the step (d) the new search height is determined to be the same as the search height.

5. The method of claim 1, wherein during the step (d) the new search height is determined to be different from the search height.

6. The method of claim 1, wherein the wire bonding evaluation criteria includes signals related to a seek time of a wire bonding tool, the seek time being a time period between (i) an initiation of seeking contact between the wire bonding tool and a bonding location and (ii) a contact being declared between the wire bonding tool and the bonding location.

7. The method of claim 1, wherein the step (d) includes determining the new search height to ensure that the new search height is low enough to provide a time efficient wire bonding process while providing an acceptable level of the wire bonding evaluation criteria monitored in the step (c).

8. The method of claim 1, where the steps (a)-(d) are repeated for a plurality of iterations, wherein the new search height determined at the step (d) is the search height used in a next of the plurality of iterations.

9. The method of claim 1, where the steps (a)-(d) are repeated for a plurality of iterations until a predetermined criteria is met in consideration of the wire bonding evaluation criteria monitored in the step (c), wherein the new search height determined at the step (d) is the search height used in a next of the plurality of iterations.

10. The method of claim 1, where the steps (a)-(c) are repeated for a plurality of search heights, and wherein the step (d) includes determining the new search height using the wire bonding evaluation criteria monitored during the step (c) for each of the plurality of search heights.

11. The method of claim 1, further comprising a step of (e) determining a blockout time for subsequent wire bonding operations using the new search height determined in the step (d), the blockout time being a time after a wire bonding tool is at the search height in a wire bonding operation but before the wire bonding tool enters a seek mode.

12. A method of determining a new blockout time for a wire bonding process, the method comprising steps of:

(a) providing a blockout time, wherein the blockout time being a time after a wire bonding tool is at a search height in a wire bonding operation but before the wire bonding tool enters a seek mode;

(b) performing a plurality of wire bonding operations using the blockout time;

(c) monitoring wire bonding evaluation criteria during each of the plurality of wire bonding operations during the step (b); and (d) determining a new blockout time using the wire bonding evaluation criteria monitored during the step (c).

13. The method of claim 12, further comprising a step of determining a new search height used for subsequent wire bonding operations based on the new blockout time determined in the step (d).

14. The method of claim 13, wherein the step of determining the new search height includes increasing the search height if the new blockout time is longer, and decreasing the search height if the new blockout time is shorter.

15. The method of claim 12, wherein the search height is a height of the wire bonding tool above a bonding location prior to entering a constant velocity mode.

16. The method of claim 12, wherein the wire bonding evaluation criteria includes signals monitored during the step (c) and related to at least one of (i) a seek time of the wire bonding tool, (ii) a seek distance of the wire bonding tool, (iii) an impact force of the wire bonding tool, (iv) an impact squash of the wire bonding tool, (v) a z-axis deformation profile, (vi) a bond force oscillation profile, (vii) an ultrasonic impedance characteristic, and (viii) a servo performance of an xyz motion system of a wire bonding machine.

17. The method of claim 12, wherein the wire bonding evaluation criteria includes signals monitored during the step (c) and related to a servo performance of an xyz motion system of a wire bonding machine.

18. The method of claim 12, wherein during the step (d) the new blockout time is determined to be the same as the blockout time.

19. The method of claim 12, wherein during the step (d) the new blockout time is determined to be different from the blockout time.

20. The method of claim 12, wherein the step (d) includes determining the new blockout time to ensure that the new blockout time is short enough to provide a time efficient wire bonding process while providing an acceptable level of the wire bonding evaluation criteria monitored in the step (c).

21. The method of claim 12, wherein the steps (a)-(d) are repeated for a plurality of iterations, wherein the new blockout time determined at the step (d) is the blockout time used in a next of the plurality of iterations.

22. The method of claim 12, wherein the steps (a)-(d) are repeated for a plurality of iterations until a predetermined criteria is met in consideration of the wire bonding evaluation criteria monitored in the step (c), wherein the new blockout time determined at the step (d) is the blockout time used in a next of the plurality of iterations.

23. The method of claim 12, wherein the steps (a)-(c) are repeated for a plurality of blockout times, and wherein the step (d) includes determining the new blockout time using the wire bonding evaluation criteria monitored during the step (c) for each of the plurality of blockout times.

24. The method of claim 12, wherein the blockout time is at least a portion of a time elapsed after the wire bonding tool reaches the search height in the wire bonding operation but before the wire bonding tool enters the seek mode.

25. The method of claim 12, wherein the blockout time is a time elapsed between when the wire bonding tool enters a constant velocity mode and when the wire bonding tool enters the seek mode.

* * * * *